(12) United States Patent
Zhou et al.

(10) Patent No.: US 9,431,072 B2
(45) Date of Patent: Aug. 30, 2016

(54) ON-THE-FLY TRIMMABLE SENSE AMPLIFIER

(71) Applicant: Silicon Storage Technology, Inc., San Jose, CA (US)

(72) Inventors: Yao Zhou, Shanghai (CN); Xiaozhou Qian, Shanghai (CN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/386,815

(22) PCT Filed: Mar. 15, 2013

(86) PCT No.: PCT/US2013/032525
§ 371 (c)(1),
(2) Date: Sep. 22, 2014

(87) PCT Pub. No.: WO2013/148361
PCT Pub. Date: Oct. 3, 2013

(65) Prior Publication Data
US 2015/0055424 A1 Feb. 26, 2015

(30) Foreign Application Priority Data
Mar. 30, 2012 (CN) .......................... 2012 1 0089949

(51) Int. Cl.
G11C 7/08 (2006.01)
G11C 7/06 (2006.01)
G11C 16/26 (2006.01)

(52) U.S. Cl.
CPC ................. *G11C 7/08* (2013.01); *G11C 7/062* (2013.01); *G11C 16/26* (2013.01); *G11C 2207/002* (2013.01); *G11C 2207/2254* (2013.01)

(58) Field of Classification Search
CPC ............ G11C 7/08; G11C 7/06; G11C 7/062
USPC ....................... 365/189.15, 189.05
See application file for complete search history.

(56) References Cited

U.S. PATENT DOCUMENTS

| 5,029,130 | A * | 7/1991 | Yeh .......................... 365/185.31 |
| 6,504,779 | B2 | 1/2003 | Perner |
| 7,274,611 | B2 | 9/2007 | Roohparvar |
| 2003/0103395 | A1 | 6/2003 | Ooishi |
| 2004/0085812 | A1* | 5/2004 | Frayer ...................... 365/185.03 |
| 2006/0152970 | A1* | 7/2006 | DeBrosse et al. ............ 365/171 |

(Continued)

FOREIGN PATENT DOCUMENTS

| CN | 101496108 A | 7/2009 |
| JP | 2002-533858 | 10/2002 |

(Continued)

OTHER PUBLICATIONS

Chinese Office Action dated Mar. 24, 2015 corresponding to the related Chinese Patent Application No. 201210089949.4.

(Continued)

*Primary Examiner* — Alexander Sofocleous
*Assistant Examiner* — Alfredo Bermudez Lozada
(74) *Attorney, Agent, or Firm* — Brent Yamashita; DLA Piper LLP US

(57) ABSTRACT

A trimmable sense amplifier for use in a memory device is disclosed.

23 Claims, 9 Drawing Sheets

(56) References Cited

U.S. PATENT DOCUMENTS

| | | |
|---|---|---|
| 2008/0025111 A1* | 1/2008 | Choy et al. ............. 365/189.09 |
| 2010/0157707 A1* | 6/2010 | Dudeck et al. ............... 365/205 |
| 2011/0063934 A1 | 3/2011 | Sharma |
| 2012/0002471 A1 | 1/2012 | Dexter |

FOREIGN PATENT DOCUMENTS

| | | |
|---|---|---|
| JP | 2003-022668 | 1/2003 |
| JP | 2009-211792 | 9/2009 |
| JP | 2011 049746 A | 3/2011 |
| WO | 00/38065 | 6/2000 |

OTHER PUBLICATIONS

PCT Search Report and Written Opinion dated Jun. 10, 2013 corresponding to the related PCT Patent Application No. US13/032525.

* cited by examiner

US 9,431,072 B2

ON-THE-FLY TRIMMABLE SENSE AMPLIFIER

TECHNICAL FIELD

A trimmable sense amplifier for use in a memory device is disclosed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

Read operations usually are performed on floating gate memory cells using sense amplifiers. A sense amplifier for this purpose is disclosed in U.S. Pat. No. 5,386,158 (the "'158 Patent"), which is incorporated herein by reference for all purposes. The '158 Patent discloses using a reference cell that draws a known amount of current. The '158 Patent relies upon a current mirror to mirror the current drawn by the reference cell, and another current mirror to mirror the current drawn by the selected memory cell. The current in each current mirror is then compared, and the value stored in the memory cell (e.g., 0 or 1) can be determined based on which current is greater.

Another sense amplifier is disclosed in U.S. Pat. No. 5,910,914 (the "'914 Patent"), which is incorporated herein by reference for all purposes. The '914 Patent discloses a sense circuit for a multi-level floating gate memory cell, which can store more than one bit of data. It discloses the use of multiple dummy cells that are utilized to determine the value stored in the memory cell (e.g., 00, 01, 10, or 11). Current mirrors are utilized in this approach as well.

One issue that arises in sense amplifiers is that the performance of the sense amplifier can be affected by transistor mismatching. Transistor mismatching can be alleviated by trimming or calibrating the sense amplifiers during testing. However, for example, when transistors heat up during operation, they can become mismatched again. This can cause components such as current mirrors to behave in an unintended manner, which will cause the sense amplifier to read data inaccurately. In the prior art, there has been no mechanism for correcting transistor mismatching during operation of the sense amplifier.

What is needed is a mechanism for reducing transistor mismatching during actual operation of a sense amplifier.

SUMMARY OF THE INVENTION

The aforementioned problems and needs are addressed by providing trimmable sense amplifiers, where the sense amplifiers can be trimmed "on the fly" during operation. In one embodiment, an extra sense amplifier is provided for a set of sense amplifiers. When a certain event occurs (such as the expiration of a time interval or the passing of a thermal threshold), the trimming process is initiated. One by one, each sense amplifier in the set is tested for transistor mismatching, and the appropriate level of current to compensate for the mismatching is calculated and stored. Thereafter, during a read operation, that same level of current will be injected into the path to compensate for the transistor mismatch. The memory device can continue to operate during the trimming process, because each memory cell is connected, through a switch or similar device, to more than one sense amplifier, and during the trimming process the extra sense amplifier is used.

Other objects and features of the present invention will become apparent by a review of the specification, claims, and appended figures.

DETAILED DESCRIPTION OF THE PREFERRED EMBODIMENTS

Figure 1:
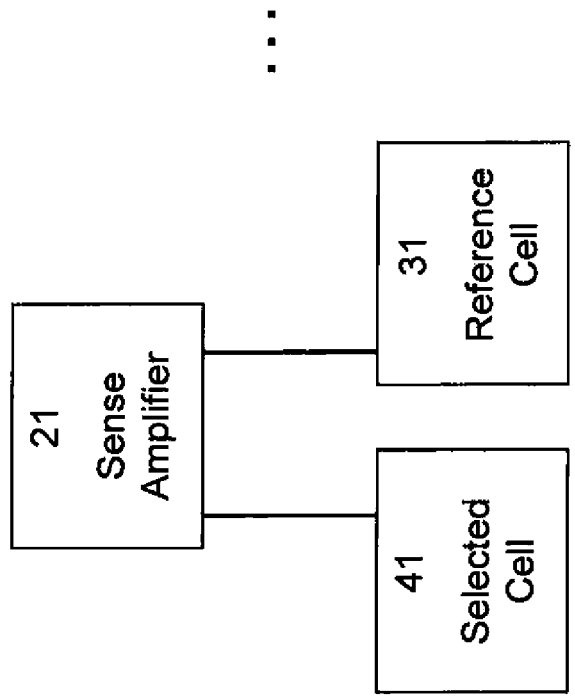
FIG. 1 is an exemplary block diagram of a prior art sensing circuit.

FIG. 1 shows a prior art configuration. Sense amplifier 21 is coupled to selected cell 41 and reference cell 31 or other type of reference circuit. Sense amplifier 21 compares the current drawn by selected cell 41 with the current drawn by reference cell 31 to determine the value stored in selected cell 41 (i.e., "0" or "1"). FIG. 1 shows a single-level cell structure, but one of ordinary skill in the art will appreciate that the prior art includes multi-level cell structures (such as one where a cell can hold two bits of data instead of one bit) and that sense amplifiers for such cells are also known.

Figure 2A:
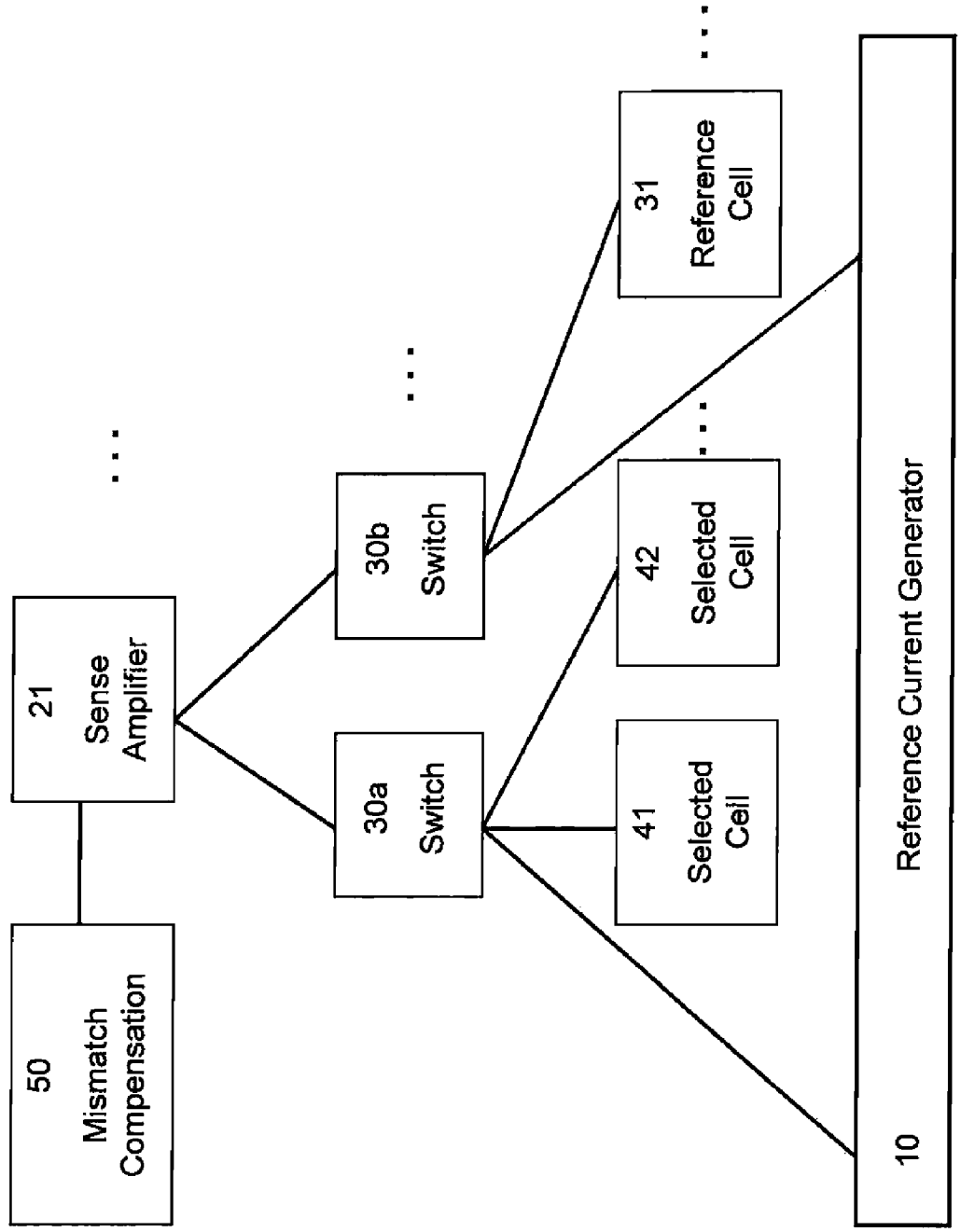
FIG. 2A is an exemplary block diagram of a sensing circuit embodiment that enables trimming of the sense amplifier.

FIG. 2A shows an embodiment of the present invention. Sense amplifier 21 is coupled to switch 30a and switch 30b. Switch 30a in turn can be coupled to reference current generator 10, selected cell 41, and selected cell 42. Switch 30b in turn can be coupled to reference current generator 10 and reference cell 31 or other type of reference circuit. Although FIG. 2A shows only two selected cells, it is understood that this depiction is exemplary only, and that a device actually can contain millions or billions of such devices. Reference current generator 10 is used during the trimming operation, as discussed in more detail below. Sense amplifier 21 also is coupled to mismatch compensation circuit 50, which is used during the trimming operation as well.

Selected cell 41 comprises one memory cell within an array of memory cells. Selected cell 41 can be selected for a read operation using a row line and column line, as is well-known to those of ordinary skill in the art. An example of the type of cell that can be used as selected cell 41 is explained in U.S. Pat. No. 7,868,375, which is incorporated herein by reference for all purposes. That patent discloses a type of cell called a split gate non-volatile memory cell. One of skill in the art will appreciate that certain types of memory cells can hold one of two different values (e.g., "0" or "1") and others can hold one of four different values (e.g., "00," "01," "10," and "11), or even more than four different values.

Figure 2B:
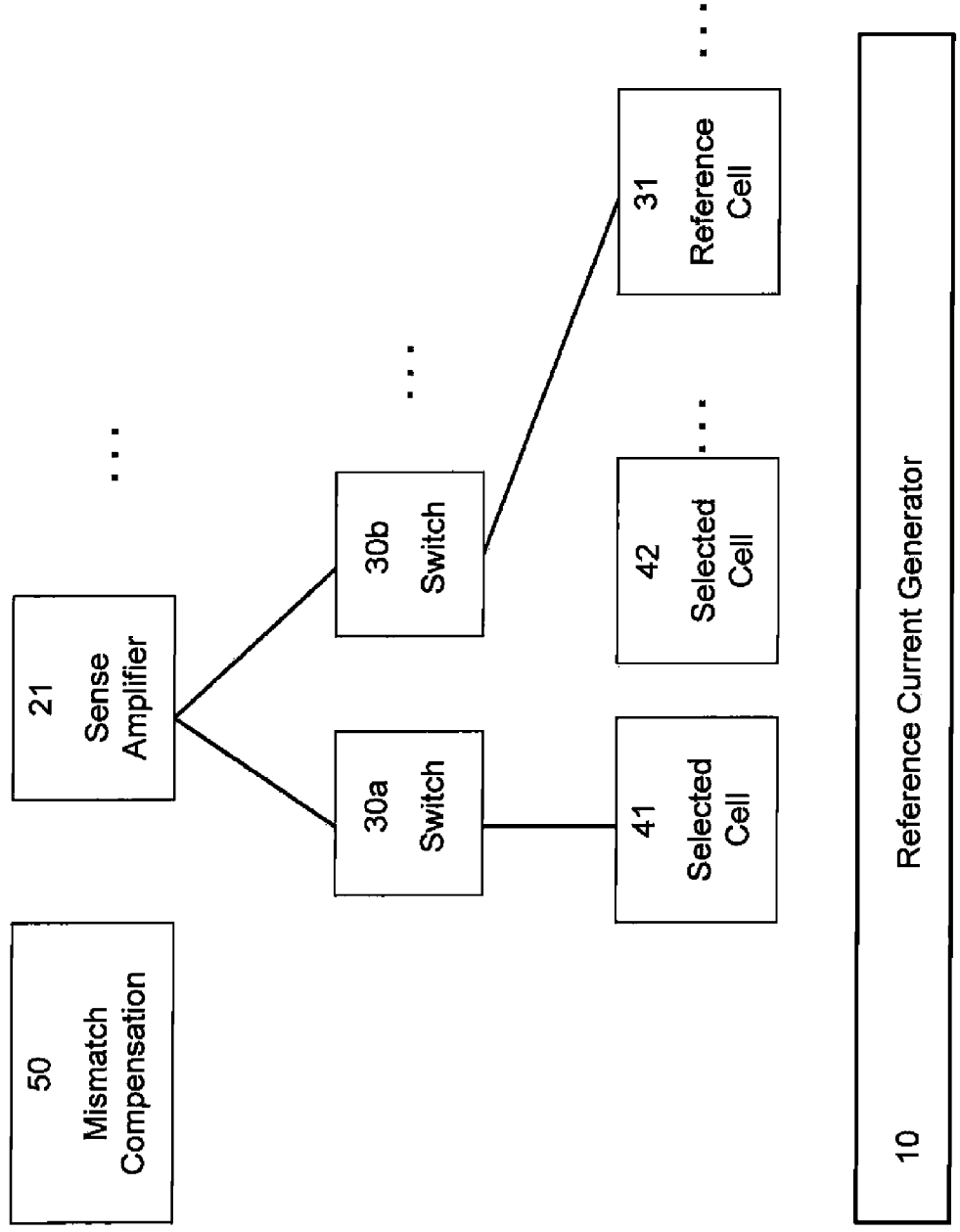
FIG. 2B is an exemplary block diagram of the embodiment shown in FIG. 2A with the switches configured for a first mode of operation.

FIG. 2B shows the same devices as in FIG. 2A. However, FIG. 2B shows sense amplifier 21 during a first mode of operation. Here, switch 30a couples sense amplifier 21 to selected cell 41, and switch 30b couples sense amplifier 21 to reference cell 31.

Figure 2C:
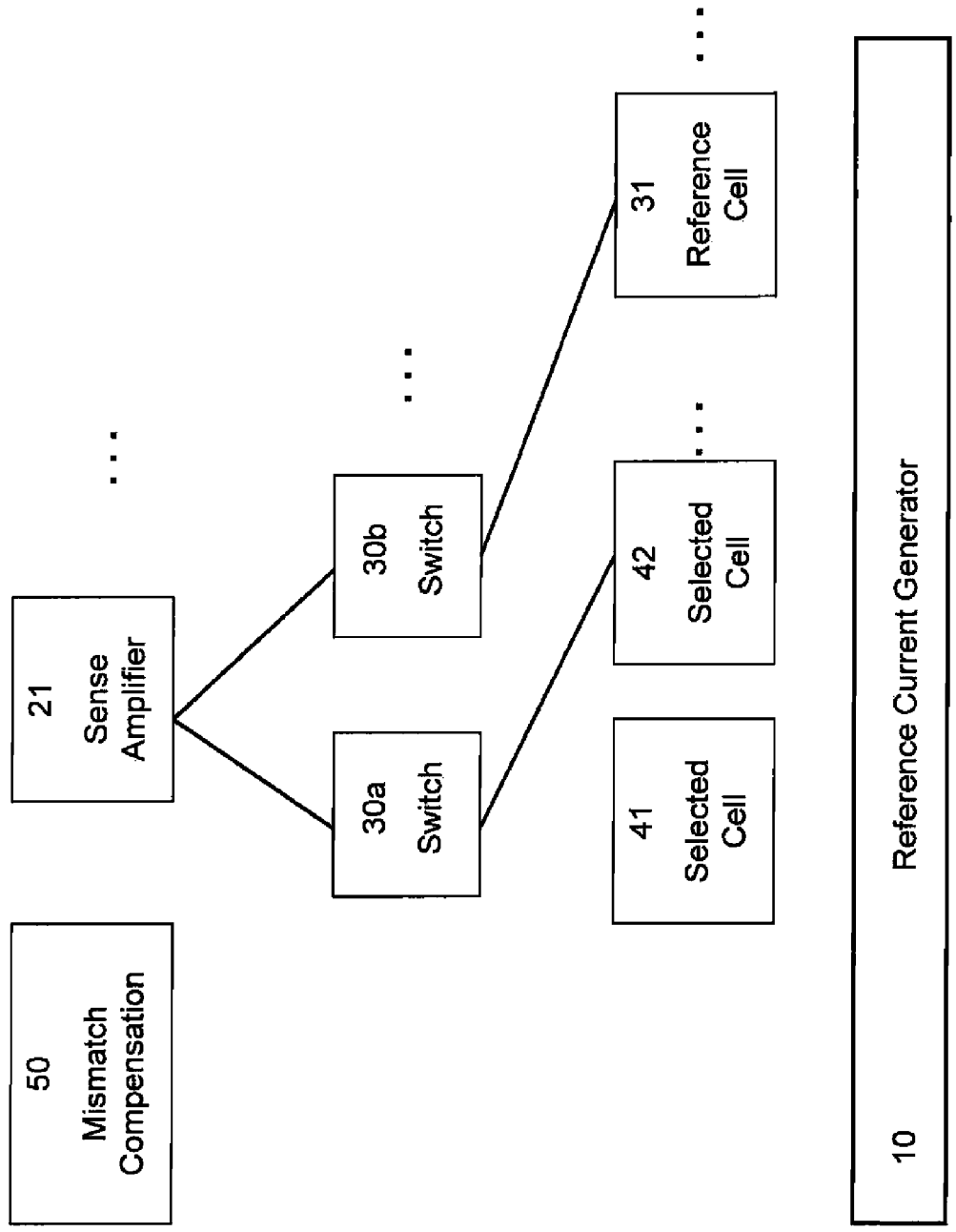
FIG. 2C is an exemplary block diagram of the embodiment shown in FIG. 2A with the switches configured for a second mode of operation.

FIG. 2C shows the same devices as in FIG. 2A. However, FIG. 2C shows sense amplifier 21 during a second mode of operation. Here, switch 30a couples sense amplifier 21 to selected cell 42, and switch 30b couples sense amplifier 21 to reference cell 31.

Figure 2D:
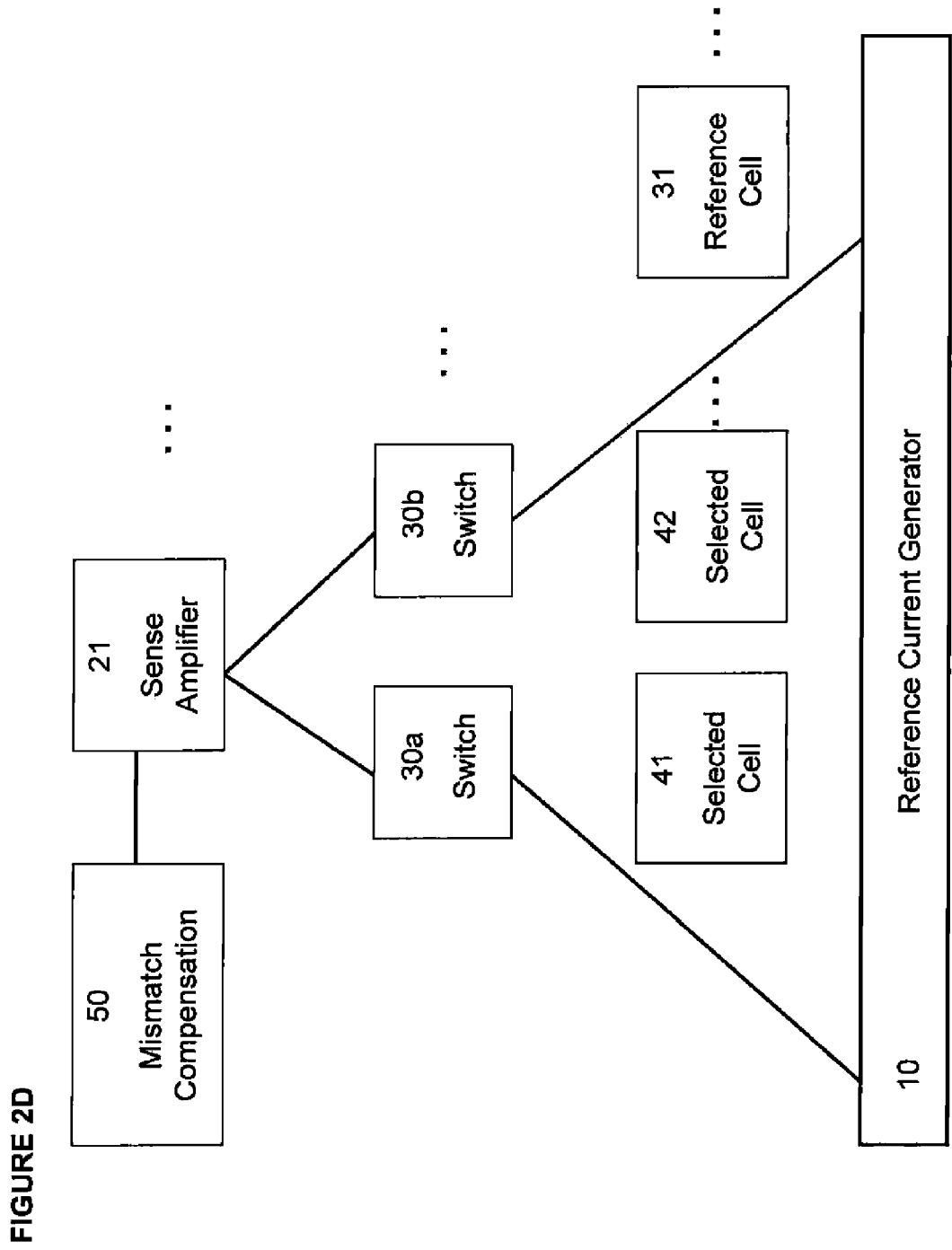
FIG. 2D is an exemplary block diagram of the embodiment shown in FIG. 2A with the switches configured for the trimming operation.

FIG. 2D shows the same devices as in FIGS. 2A, 2B, and 2C. However, FIG. 2D shows the trimming process for sense amplifier 21. Switch 30a couples sense amplifier 21 to reference current generator 10, and switch 30b couples sense amplifier 21 to reference current generator 10. Once this occurs, sense amplifier 21 is no longer coupled to selected cell 41 and reference cell 31. Without nothing more, selected cell 41 would be unavailable for reading. This issue is overcome using the embodiment shown in FIG. 4 and discussed below.

Figure 3:
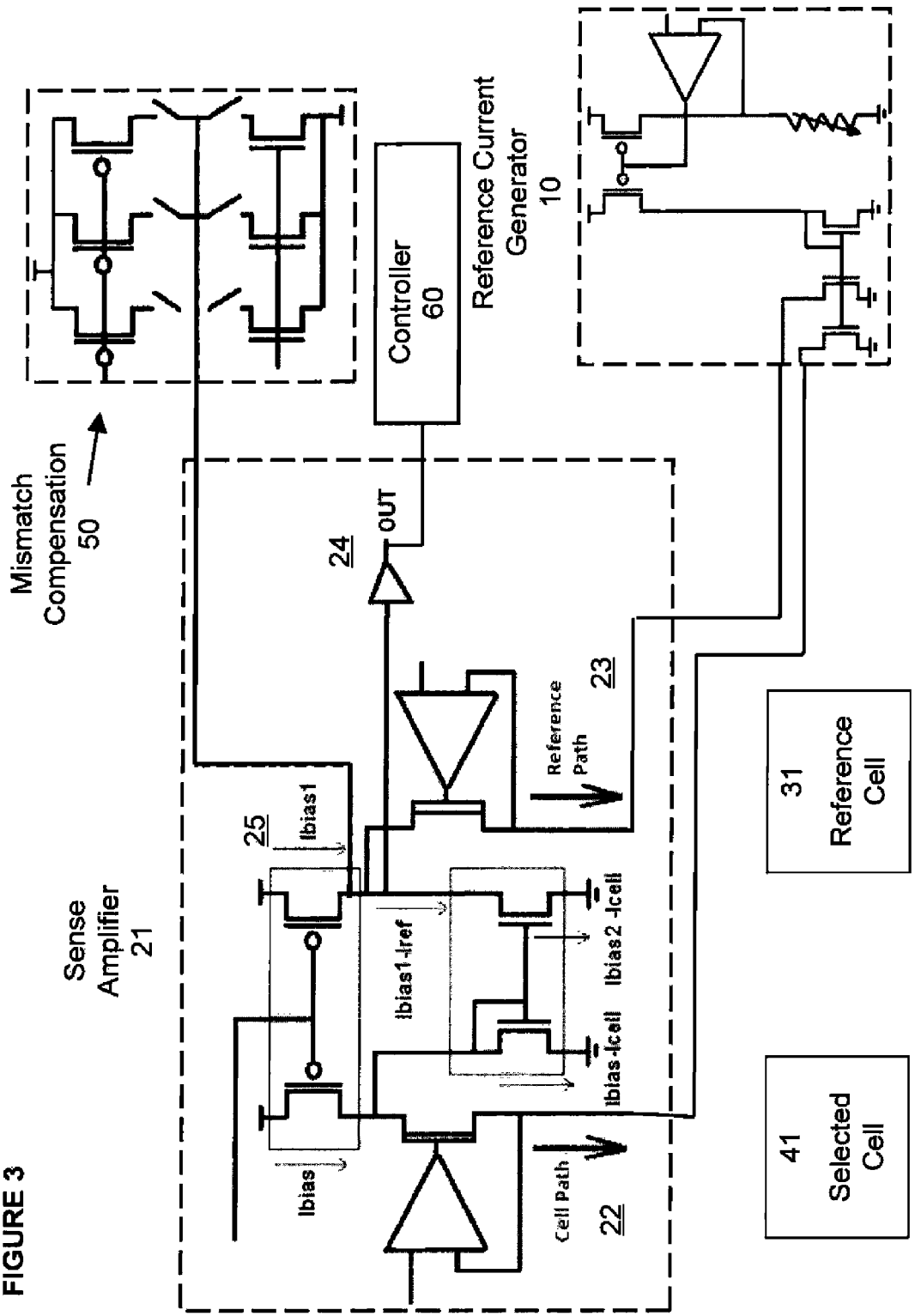
FIG. 3 is a circuit diagram of the embodiment of a sensing circuit of FIG. 2.

FIG. 3 shows aspects of the embodiment in further detail. As in FIGS. 2A-2C, sense amplifier 21 is coupled to mismatch compensation circuit 50 and reference current generator 10 during the trimming process through switch 30a and switch 30b (not shown in FIG. 3 for simplicity). At that point in time, switch 30a no longer connects sense amplifier 21 to selected cell 41, and switch 30b no longer connects sense amplifier 21 to reference cell 31.

During the trimming process, reference current generator 10 will draw equal amounts of current from cell path 22 and reference path 23. Cell path 22 normally is coupled to selected cell 41, and reference path 23 normally is coupled to reference cell 31, and output 24 normally indicates the inverted value of the value stored in selected cell 41. That is, if selected cell 41 is storing a "0," output 24 should be a "1," and if selected cell 41 is storing a "1," output 24 should be a "0."

During the trimming process, output 24 is coupled to controller 60. Reference current generator 10 and mismatch compensation circuit 50 also are coupled to controller 60. Reference current generator 10 first will generate a current level that is the same as the trip level between "0" and "1" for the type of selected cell. Controller 60 reads output 24. If it indicates a "0," then transistor mismatching likely has occurred. Controller 60 will cause mismatch compensation circuit 50 to inject current to the drain of PMOS transistor 25. It raises the voltage in increments until a "1" is detected at output 24. When this happens, controller 60 records the level of the current injected by mismatch compensation circuit 50.

If the initial reading of output 24 indicates a "1," then transistor mismatching likely has occurred. Controller 60 will cause mismatch compensation circuit 50 to draw current from the drain of PMOS transistor 25. It raises the voltage in increments until "0" is detected at output 24. When this happens, controller 60 records the level of the current caused by mismatch compensation circuit 50.

In situations where mismatching has occurred, controller 60 will store data indicating the level of voltage that can offset the mismatching for that particular sense amplifier 21. Thereafter, whenever sense amplifier 21 performs a read operation, mismatch compensation circuit 50 will cause the drain of PMOS transistor 25 to have a voltage equal to the voltage that was determined to be the appropriate level of offsetting the transistor mismatching.

In the example just provided, the selected cell was a single level cell. However, the same approach can be used for multi-level cells. For example, one form of known multi-level cell is a cell that can store one of four possible values. For such a cell, there will be three different reference cells, each with a different level of current, and each reference cell will have an associated set of transistors in the sense amplifier and an output similar to output 24. The trim process described previously will be performed three different times, one for each portion of the sense amplifier associated with a particular reference cell.

During the first procedure, the reference current generator will generate a current equal to the trip level between "0" and "1" for the selected cell as to the first reference cell, and the first output will be monitored. The trim process for this reference call will otherwise be the same as described above, and the controller 60 will record the level of the current caused by mismatch compensation circuit 50 as to that portion of the sense amplifier.

During the second procedure, the reference current generator will generate a current equal to the trip level between "0" and "1" for the selected call as to the second reference cell, and the second output will be monitored. The trim process will otherwise be the same as described above, and the controller 60 will record the level of the current caused by mismatch compensation circuit 50 as to that portion of the sense amplifier.

During the third procedure, the reference current generator will generate a current equal to the trip level between "0" and "1" for the selected cell as to the third reference cell, and the third output will be monitored. The trim process will otherwise be the same as described above, and the controller 60 will record the level of the current caused by mismatch compensation circuit 50 as to that portion of the sense amplifier.

For simplicity; the embodiments described below will assume a single level cell, but one of ordinary skill in the art will understand that the same approach can be used with multi-level cells.

Figure 4A:
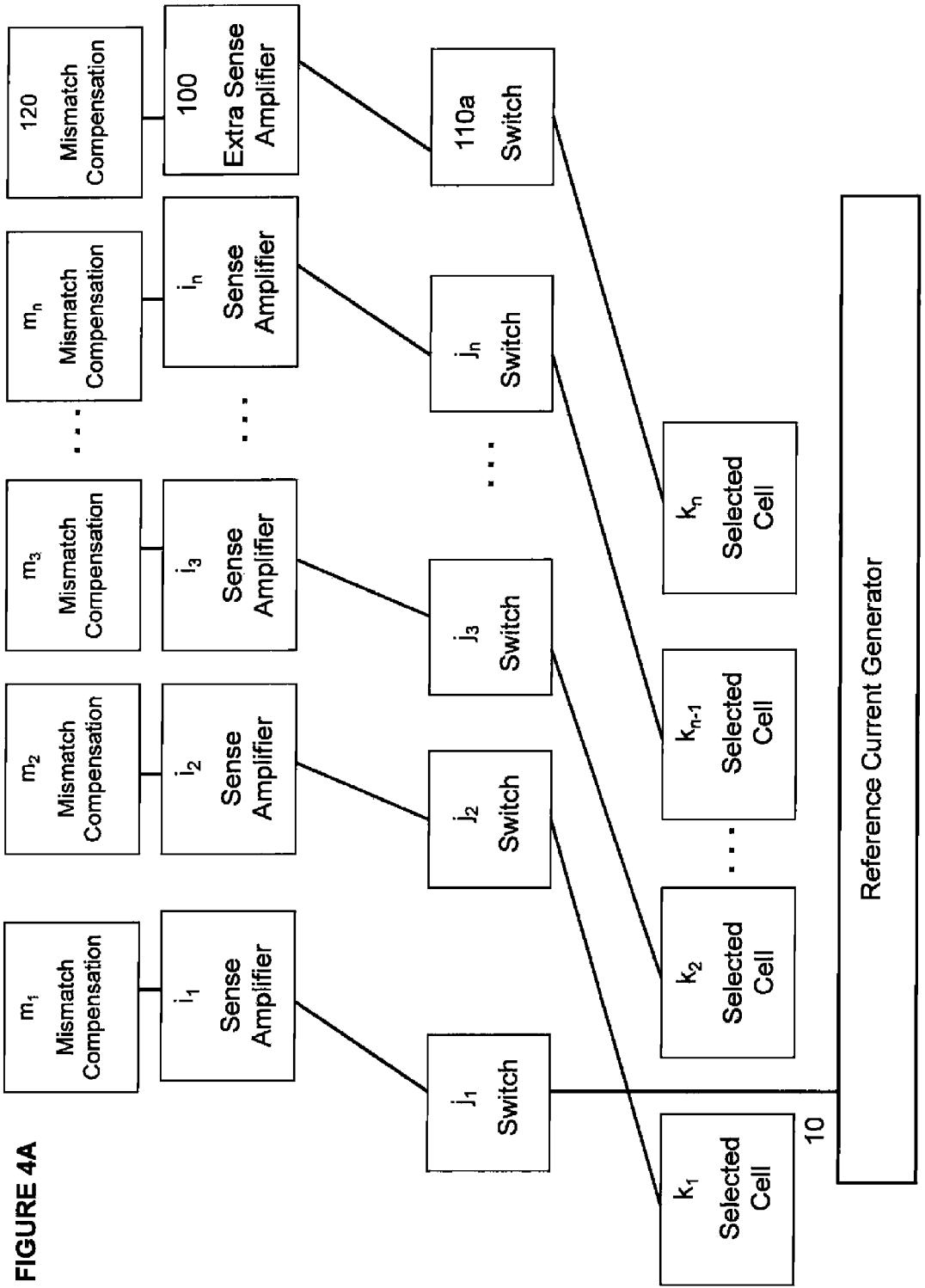
FIG. 4A is an exemplary block diagram of the configuration used during the trimming process to ensure that each selected cell is connected to a sense amplifier.

FIG. 4A shows an aspect of the embodiment that enables the memory device to continue to operate while the trimming operation is ongoing. It will be appreciated that sense amplifier 21, selected cell 41, and reference cell 31, discussed in previous figures, are exemplary and that a typical memory product will contain millions or billions of such units. FIG. 4A depicts a set of such units. For simplicity's sake, FIG. 4A shows only selected cells and not reference cells. FIG. 4A shows sense amplifier $i_1$, sense amplifier $i_2$, . . . sense amplifier $i_n$, where n is an integer. During normal operation, each sense amplifier will be coupled to a selected cell and a reference call. When one of the sense amplifiers is being trimmed, then extra sense amplifier 100 and its associated switches, here switch 100a, will be used to ensure that each selected cell still will be associated with a sense amplifier and therefore will be available to be read. Each sense amplifier $i_1$ . . . $i_n$ is coupled to a mismatch compensation circuit $m_1$ . . . $m_n$.

Again with reference to FIG. 4A, during the trim process, extra sense amplifier 100, which is coupled to mismatch compensation circuit 102, is coupled by switch 100a to selected cell $k_n$. Selected cell $k_n$ is normally associated with sense amplifier $i_n$ during situations where trimming is not occurring. During the trim process, however, sense amplifier $i_n$ will be coupled by switch $j_n$ to selected cell $k_{n-1}$. This will propagate down the chain, until sense amplifier $i_2$ is coupled by switch $j_2$ to selected cell $k_1$. Selected cell $k_1$ normally is associated with sense amplifier $i_1$, but during the trim process for sense amplifier $i_1$ is associated with sense amplifier $i_2$. This method can be referred to as a "bubble trim" method. In this example, sense amplifier $i_1$ will be available to be trimmed, and all selected cells k still are available to be read.

Figure 4B:
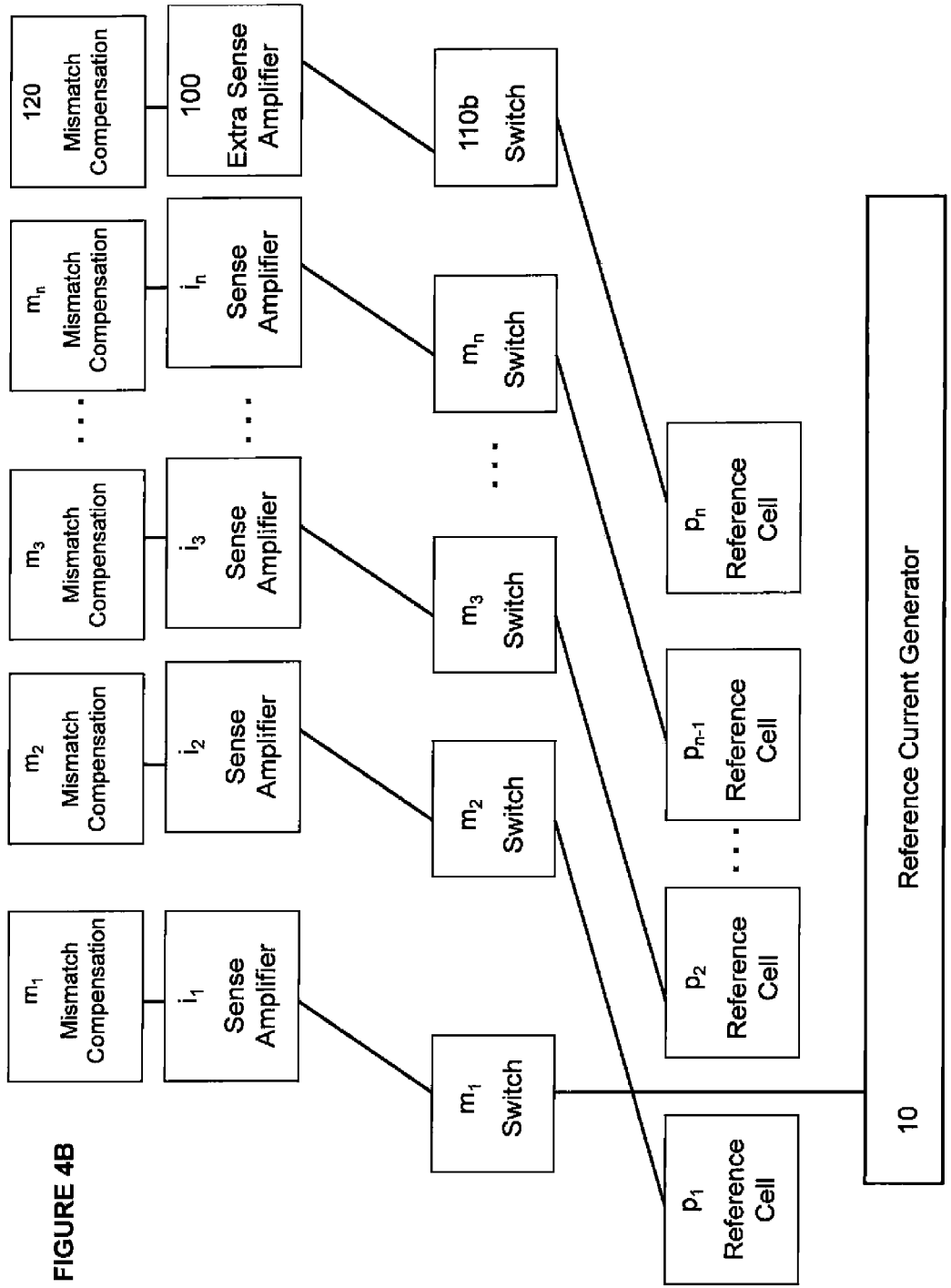
FIG. 4B is an exemplary block diagram of the configuration used during the trimming process to ensure that each reference cell is connected to a sense amplifier.

FIG. 4A shows only selected cells and not reference cells. FIG. 4B shows the reference cells and not the selected cells, again for simplicity's sake. In FIG. 4B, extra sense amplifier 100 is coupled to reference cell $p_n$ through switch 110b. Sense amplifier $i_n$ will be coupled through switch $m_n$, to reference cell $p_{n-1}$. This will propagate down the chain, until sense amplifier $i_2$ is coupled by switch $m_2$ to reference cell $p_1$. Reference cell $p_1$ normally is associated with sense amplifier $i_1$, but during the trim process for sense amplifier $i_1$ is associated with sense amplifier $i_2$.

FIGS. 4A and 4B show the couplings used when sense amplifier $i_1$ is trimmed. After sense amplifier $i_1$ is trimmed, each of the other sense amplifiers can be trimmed. $i_1$ will once again be coupled to selected cell $k_1$ and reference cell $p_1$. When sense amplifier $i_2$ is trimmed, sense amplifier $i_3$ will be coupled to selected cell $k_2$ and reference cell $p_2$, and so on, and extra sense amplifier 100 will be coupled to selected cell $k_n$ and reference cell $p_n$. Thus, it will be appreciated that every sense amplifier can be trimmed during actual operation of the memory device without affecting the memory read operation, and all selected cells still will be available to be read.

Thus, with reference to FIGS. 4A and 4B, at any given time, switches $j_1 \ldots j_n$ and switch 110a connect all but one of sense amplifiers $i_1 \ldots i_n$ and extra sense amplifier 100 to selected cells $k_1 \ldots k_n$, and switches $m_1 \ldots m_n$ and switch 110b connect all but one of sense amplifiers $i_1 \ldots i_n$ and extra sense amplifier 100 to selected cells $k_1 \ldots k_n$. The switching operation is the same as described previously for FIGS. 2A 2B, and 2C, where switch 30a would be one of switches $j_1 \ldots j_n$ and switch 30b would be one of switches $m_1 \ldots m_n$.

Figure 4C:
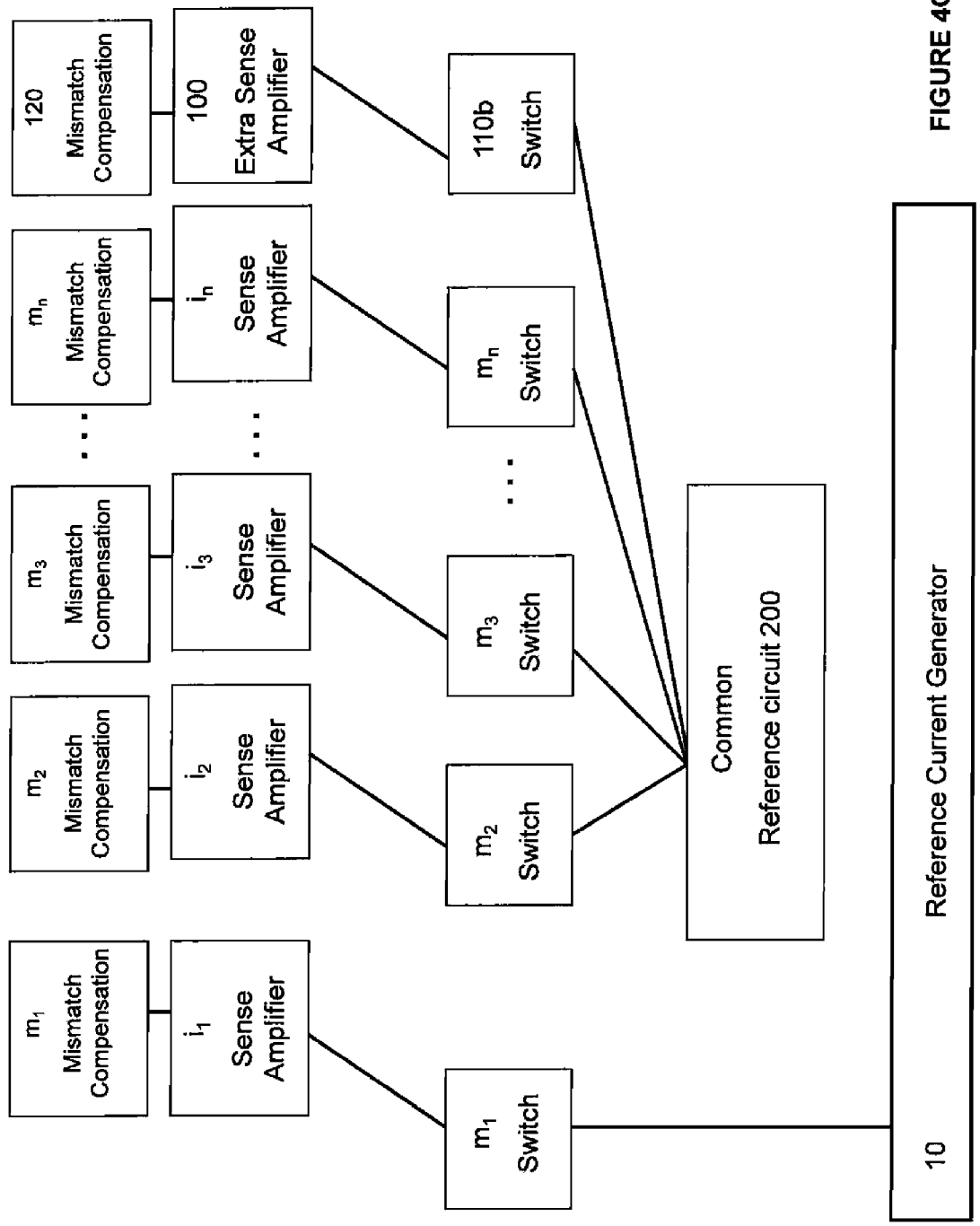
FIG. 4C is an exemplary block diagram of the configuration used during the trimming process to implement a common reference circuit connected to a plurality of sense amplifiers.

FIG. 4C shows another embodiment for the trimming process. Here, a common reference circuit 200 (such as a common reference memory cell) can be coupled to switches $m_1 \ldots m_n$ and switch 110b such that each sense amplifier $i_1 \ldots i_n$ and extra sense amplifier 100 can share a common reference circuit 200 instead of each having its own dedicated reference circuit.

The trimming process can be initiated in response to a command from a user, driver, of other software, or in response to the elapsing of a certain amount of time or in response to a temperature threshold being crossed. The latter is useful because transistor mismatching worsens as temperature changes. Thermal sensors are well-known to those of skill in the art References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A method for trimming a sense amplifier, comprising:
    coupling a first sense amplifier to a selected memory cell and a reference circuit during a read operation;
    decoupling the first sense amplifier from the selected memory cell and the reference circuit during a trim operation of the first sense amplifier;
    coupling the selected memory cell and the reference circuit to a second sense amplifier during the trim operation of the first sense amplifier;
    performing the trim operation of the first sense amplifier and determining a current level to compensate of transistor mismatching; and
    after the trim operation is terminated, coupling the first sense amplifier to the selected memory cell and the reference circuit and applying the current level to the first sense amplifier during a read operation of the selected memory cell.

2. The method of claim 1, wherein the selected memory cell is a split gate non-volatile memory cell.

3. The method of claim 2, wherein the selected memory cell can store one of two different values.

4. The method of claim 2, wherein the selected memory cell can store one of four different values.

5. The method of claim 1, wherein the first sense amplifier is coupled to the selected cell through a switch.

6. The method of claim 1, wherein the reference circuit comprises a reference memory cell.

7. The method of claim 1, wherein the determining step comprises:
    coupling the first sense amplifier to a reference current generator and a compensation circuit;
    drawing current from the first sense amplifier using the reference current generator;
    identifying transistor mismatching by monitoring the output of the first sense amplifier; and
    applying a current flow to a node within the first sense amplifier to compensate for the transistor mismatching.

8. The method of claim 7, wherein the selected memory cell is a split gate non-volatile memory cell.

9. The method of claim 8, wherein the selected memory cell can store one of two different values.

10. The method of claim 8, wherein the selected memory cell can store one of four different values.

11. The method of claim 7, wherein the first sense amplifier is coupled to the selected cell through a switch.

12. A memory device, comprising:
    a first sense amplifier for coupling to a selected memory cell and a reference circuit;
    a second sense amplifier for coupling to the selected memory cell and the reference circuit; and
    a switch for switching the coupling of the selected memory cell and the reference circuit from the first sense amplifier to the second sense amplifier during a trim operation of the first sense amplifier and for switching the coupling of the selected memory cell and the reference circuit from the second sense amplifier to the first sense amplifier after the trim operation is terminated; and a control for storing results from the trim operation of the first sense amplifier and adjusting a voltage of a node in the first sense amplifier based on the results after the trim operation is terminated.

13. The memory device of claim 12, wherein the selected memory cell is a split gate non-volatile memory cell.

14. The memory device of claim 13, wherein the selected memory cell can store one of two different values.

15. The memory device of claim 13, wherein the selected memory cell can store one of four different values.

16. The memory device of claim 12, wherein the memory device is configured to perform a trim operation on the first sense amplifier when the second sense amplifier is coupled to the selected memory cell and the reference circuit.

17. The memory device of claim 16, wherein the first sense amplifier is coupled to a reference current generator and a compensation circuit during the trim operation.

18. The memory device of claim 17, wherein the selected memory cell is a split gate non-volatile memory cell.

19. The memory device of claim 18, wherein the selected memory cell can store one of two different values.

20. The memory device of claim 18, wherein the selected memory cell can store one of four different values.

21. The memory device of claim 12, wherein the reference circuit comprises a reference memory cell.

22. A memory device, comprising:
a sense amplifier selectively coupled to a selected memory cell and reference circuit to perform a read operation of the selected memory cell;
a mismatch compensation circuit selectively coupled to the sense amplifier for performing a trim operation of the sense amplifier when a read operation is not being performed;
a reference current generator coupled to the sense amplifier; and
a controller coupled to the sense amplifier and the mismatch compensation circuit for offsetting a transistor mismatch in the sense amplifier by changing a voltage of a node in the sense amplifier to a voltage level determined during the trim operation.

23. The memory device of claim 2, wherein the reference current generator is coupled to the sense amplifier through a switch.

* * * * *